(12) United States Patent
Huang

(10) Patent No.: US 10,373,832 B2
(45) Date of Patent: Aug. 6, 2019

(54) DYNAMIC RANDOM ACCESS MEMORY WITH LOW LEAKAGE CURRENT AND RELATED MANUFACTURING METHOD THEREOF

(71) Applicant: Etron Technology, Inc., Hsinchu (TW)

(72) Inventor: Li-Ping Huang, Taipei (TW)

(73) Assignee: Etron Technology, Inc., Hsinchu (TW)

( * ) Notice: Subject to any disclaimer, the term of this patent is extended or adjusted under 35 U.S.C. 154(b) by 122 days.

(21) Appl. No.: 15/672,270

(22) Filed: Aug. 8, 2017

(65) Prior Publication Data

US 2018/0040481 A1    Feb. 8, 2018

Related U.S. Application Data

(60) Provisional application No. 62/371,847, filed on Aug. 8, 2016.

(51) Int. Cl.
| | | |
|---|---|---|
| H01L 21/265 | (2006.01) | |
| H01L 21/822 | (2006.01) | |
| H01L 27/108 | (2006.01) | |
| H01L 29/66 | (2006.01) | |
| H01L 29/78 | (2006.01) | |

(52) U.S. Cl.
CPC .. *H01L 21/26513* (2013.01); *H01L 21/26586* (2013.01); *H01L 21/822* (2013.01); *H01L 27/10873* (2013.01); *H01L 27/10876* (2013.01); *H01L 27/10888* (2013.01); *H01L 29/6659* (2013.01); *H01L 29/66621* (2013.01); *H01L 29/66659* (2013.01); *H01L 29/7834* (2013.01); *H01L 21/26553* (2013.01)

(58) Field of Classification Search
CPC ......... H01L 21/26513; H01L 21/26586; H01L 27/10876; H01L 29/66659; H01L 27/10888; H01L 27/10873; H01L 21/822; H01L 29/6659; H01L 21/26553
See application file for complete search history.

(56) References Cited

U.S. PATENT DOCUMENTS

| | | | | |
|---|---|---|---|---|
| 2005/0133836 A1* | 6/2005 | Seo | ...................... | H01L 29/4236 257/288 |
| 2005/0167741 A1* | 8/2005 | Divakaruni | ....... | H01L 21/28114 257/328 |
| 2006/0097314 A1* | 5/2006 | Uchiyama | ......... | H01L 21/28061 257/330 |
| 2007/0064494 A1* | 3/2007 | Morton | .............. | G11C 16/0416 365/185.28 |
| 2013/0200451 A1* | 8/2013 | Yilmaz | ............... | H01L 29/4236 257/331 |

FOREIGN PATENT DOCUMENTS

TW        200603232      1/2006

* cited by examiner

*Primary Examiner* — Karen Kusumakar
(74) *Attorney, Agent, or Firm* — Winston Hsu

(57) ABSTRACT

A manufacturing method of dynamic random access memory (DRAM) with low leakage current includes forming a plurality of gates within a substrate of the DRAM; forming a plurality of drain/sources within the substrate of the DRAM by a first ion implantation; and forming a plurality of lightly doped drains under all of the plurality of drain/sources or partial drain/sources of the plurality of drain/sources by a second ion implantation after the plurality of drain/sources are formed. The plurality of lightly doped drains is used for reducing a leakage current within the DRAM, and the second ion implantation has a predetermined incident angle.

22 Claims, 9 Drawing Sheets

DYNAMIC RANDOM ACCESS MEMORY WITH LOW LEAKAGE CURRENT AND RELATED MANUFACTURING METHOD THEREOF

CROSS REFERENCE TO RELATED APPLICATIONS

This application claims the benefit of U.S. Provisional Application No. 62/371,847, filed on 2016 Aug. 8, and entitled "Tilt implant for reducing leakage current," the contents of which are incorporated herein by reference.

BACKGROUND OF THE INVENTION

1. Field of the Invention

The present invention relates to a dynamic random access memory with low leakage current and a related manufacturing method thereof, and particularly to a dynamic random access memory and a related manufacturing method thereof that can utilize lightly doped drains to reduce leakage current within the dynamic random access memory.

2. Description of the Prior Art

Because a size of a trench dynamic random access memory provided by the prior art is gradually reduced, electric fields between a plurality of drain/sources and a plurality of gates of the trench dynamic random access memory are increased accordingly, resulting in Hot-Carrier effect of junctions between the plurality of drain/sources and the plurality of gates being increased. Because the Hot-Carrier effect of the junctions between the plurality of drain/sources and the plurality of gates is increased, tunneling leakage currents of the junctions between the plurality of drain/sources and the plurality of gates are also increased with increase of the Hot-Carrier effect. In addition, voltage drops between the plurality of drain/sources and a substrate of the trench dynamic random access memory can also make greater junction leakage currents exist between the plurality of drain/sources and the substrate. Thus, the greater junction leakage currents and the greater tunneling leakage currents will make standby time of portable electronic products with the dynamic random access memory be significantly reduced. Therefore, how to improve the trench dynamic random access memory becomes an important issue of a designer of the trench dynamic random access memory.

SUMMARY OF THE INVENTION

An embodiment of the present invention provides a manufacturing method of a dynamic random access memory with low leakage current. The manufacturing method includes forming a plurality of gates of the dynamic random access memory within a substrate of the dynamic random access memory; forming a plurality of drain/sources of the dynamic random access memory within the substrate by a first ion implantation; and forming a plurality of lightly doped drains under all of the plurality of drain/sources or partial drain/sources of the plurality of drain/sources by a second ion implantation after the plurality of drain/sources are formed, wherein the plurality of lightly doped drains is used for reducing a leakage current within the dynamic random access memory, and the second ion implantation has a predetermined incident angle.

Another embodiment of the present invention provides a dynamic random access memory with low leakage current. The dynamic random access memory includes a substrate, a plurality of gates, a plurality of drain/sources, and a plurality of lightly doped drains. The plurality of gates are formed within the substrate. The plurality of drain/sources are formed within the substrate by a first ion implantation. The plurality of lightly doped drains are formed under all of the plurality of drain/sources or partial drain/sources of the plurality of drain/sources by a second ion implantation, wherein the plurality of lightly doped drains is used for reducing a leakage current within the dynamic random access memory, and the second ion implantation has a predetermined incident angle.

Another embodiment of the present invention provides a dynamic random access memory with low leakage current. The dynamic random access memory includes a substrate, a plurality of gates, a plurality of drain/sources, and a plurality of lightly doped drains. The plurality of gates are formed within the substrate. The plurality of drain/sources are formed within the substrate by a first ion implantation. The plurality of lightly doped drains are formed under all of the plurality of drain/sources or partial drain/sources of the plurality of drain/sources by a second ion implantation, wherein the plurality of lightly doped drains is used for reducing a leakage current within the dynamic random access memory.

Another embodiment of the present invention provides a dynamic random access memory with low leakage current. The dynamic random access memory includes a substrate, a plurality of gates, a plurality of drain/sources, and a plurality of lightly doped drains. The plurality of gates are formed within the substrate. The plurality of drain/sources are formed within the substrate. Lightly doped drains are formed on side walls of two adjacent gates, and the lightly doped drains are under corresponding drain/sources.

Another embodiment of the present invention provides a dynamic random access memory with low leakage current. The dynamic random access memory includes a substrate, a plurality of gates, a plurality of drain/sources, a plurality of isolation layers, and a plurality of lightly doped drains. The plurality of gates are formed within the substrate. The plurality of drain/sources are formed within the substrate. The plurality of isolation layers formed within the substrate, and each isolation layer is located between two gates. Lightly doped drains are formed on side walls of the two gates facing the each isolation layer and side walls of the each isolation layer, and the lightly doped drains are under corresponding drain/sources.

The present invention provides a dynamic random access memory with low leakage current and a related manufacturing method thereof. Because the present invention forms a plurality of lightly doped drains under all of a plurality of drain/sources of the dynamic random access memory or partial drain/sources of the plurality of drain/sources of the dynamic random access memory, the plurality of lightly doped drains can make electric fields between the plurality of drain/sources and a plurality of gates of the dynamic random access memory and electric fields between the plurality of drain/sources and a substrate of the dynamic random access memory be reduced, resulting in hot carriers existing between the plurality of drain/sources and the plurality of gates, and between the plurality of drain/sources and the substrate being reduced. Therefore, the plurality of lightly doped drains can effectively reduce tunneling leakage currents of junctions between the plurality of drain/sources and the plurality of gates, and junction leakage currents existing between the plurality of drain/sources and the substrate. That is to say, the plurality of lightly doped drains can effectively reduce total leakage current of the dynamic random access memory. Thus, the present invention can make standby time of portable electronic products with the dynamic random access memory be significantly increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
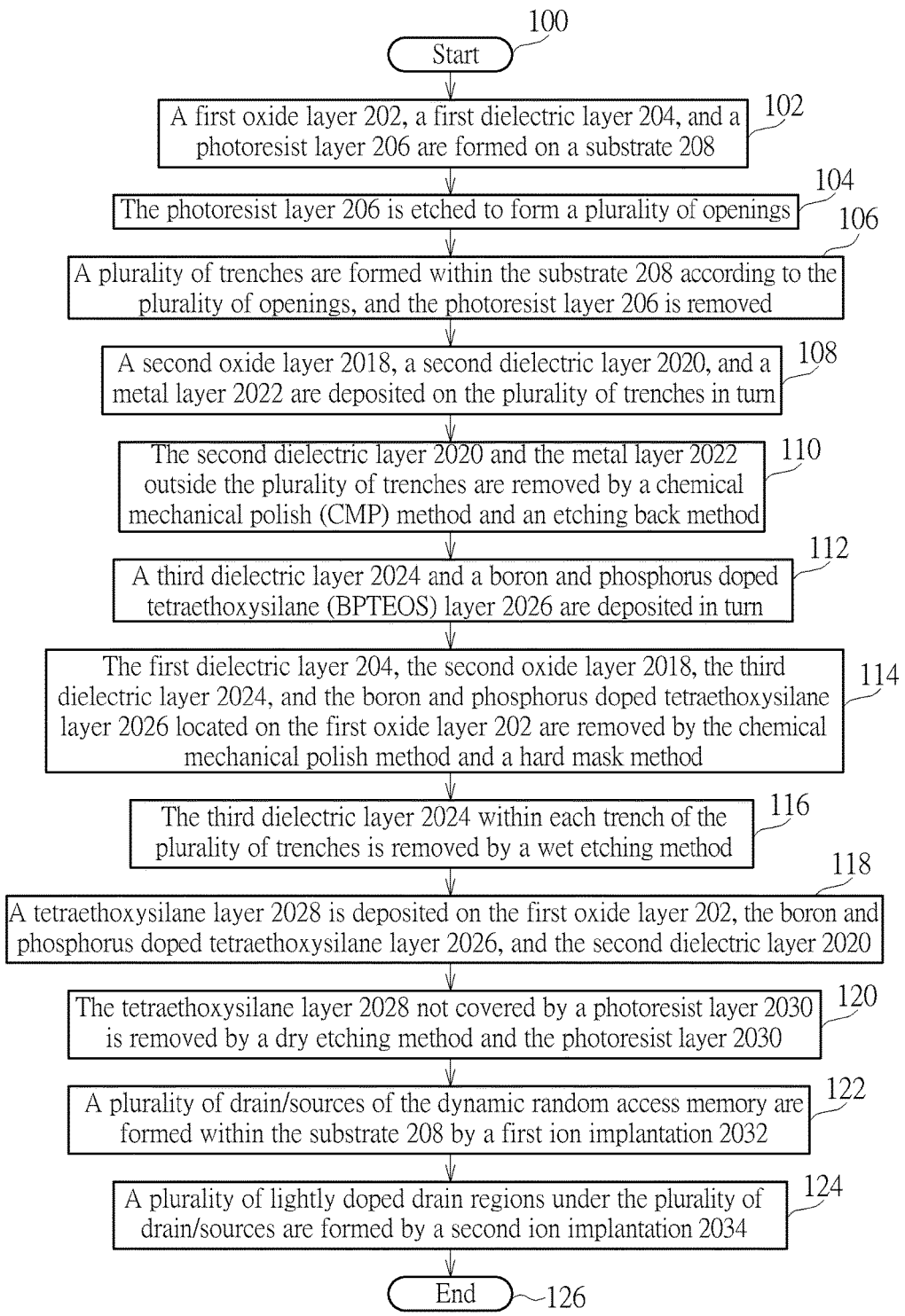
FIG. 1 is a flowchart illustrating a manufacturing method of dynamic random access memory with low leakage current according to an embodiment of the present invention.

Please refer to FIGS. 1-15. FIG. 1 is a flowchart illustrating a manufacturing method of dynamic random access memory with low leakage current according to an embodiment of the present invention, wherein the dynamic random access memory is a trench dynamic random access memory. The manufacturing method in FIG. 1 is illustrated using FIGS. 2-15. Detailed steps are as follows:

Step 100: Start.

Step 102: A first oxide layer 202, a first dielectric layer 204, and a photoresist layer 206 are formed on a substrate 208.

Step 104: The photoresist layer 206 is etched to form a plurality of openings.

Step 106: A plurality of trenches are formed within the substrate 208 according to the plurality of openings, and the photoresist layer 206 is removed.

Step 108: A second oxide layer 2018, a second dielectric layer 2020, and a metal layer 2022 are deposited on the plurality of trenches in turn.

Step 110: The second dielectric layer 2020 and the metal layer 2022 outside the plurality of trenches are removed by a chemical mechanical polish (CMP) method and an etching back method.

Step 112: A third dielectric layer 2024 and a boron and phosphorus doped tetraethoxysilane (BPTEOS) layer 2026 are deposited in turn.

Step 114: The first dielectric layer 204, the second oxide layer 2018, the third dielectric layer 2024, and the boron and phosphorus doped tetraethoxysilane layer 2026 located on the first oxide layer 202 are removed by the chemical mechanical polish method and a hard mask method.

Step 116: The third dielectric layer 2024 within each trench of the plurality of trenches is removed by a wet etching method.

Step 118: A tetraethoxysilane layer 2028 is deposited on the first oxide layer 202, the boron and phosphorus doped tetraethoxysilane layer 2026, and the second dielectric layer 2020.

Step 120: The tetraethoxysilane layer 2028 not covered by a photoresist layer 2030 is removed by a dry etching method and the photoresist layer 2030.

Step 122: A plurality of drain/sources of the dynamic random access memory are formed within the substrate 208 by a first ion implantation 2032.

Step 124: A plurality of lightly doped drain regions under the plurality of drain/sources are formed by a second ion implantation 2034.

Step 126: End.

Figure 2:
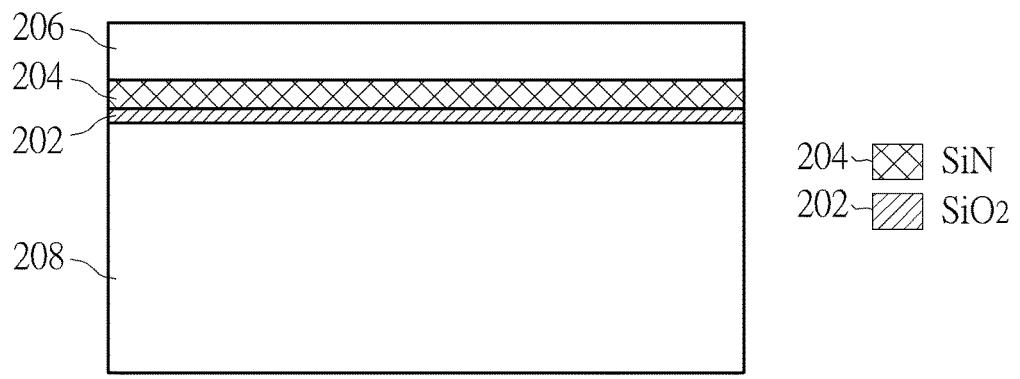
FIG. 2 is a diagram illustrating the first dielectric layer, the first oxide layer, and the photoresist layer forming on the substrate.
Figure 3:
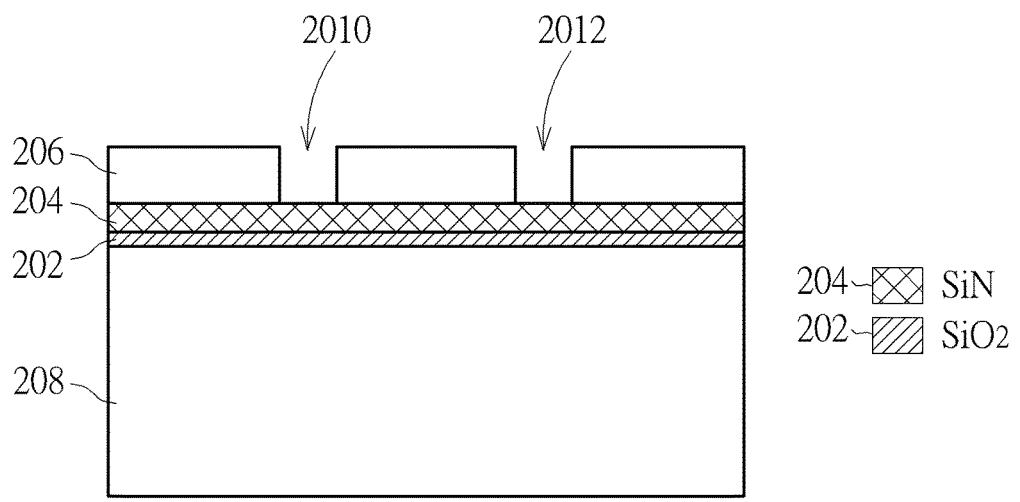
FIG. 3 is a diagram illustrating the photoresist layer being etched to form the plurality of openings.
Figure 4:
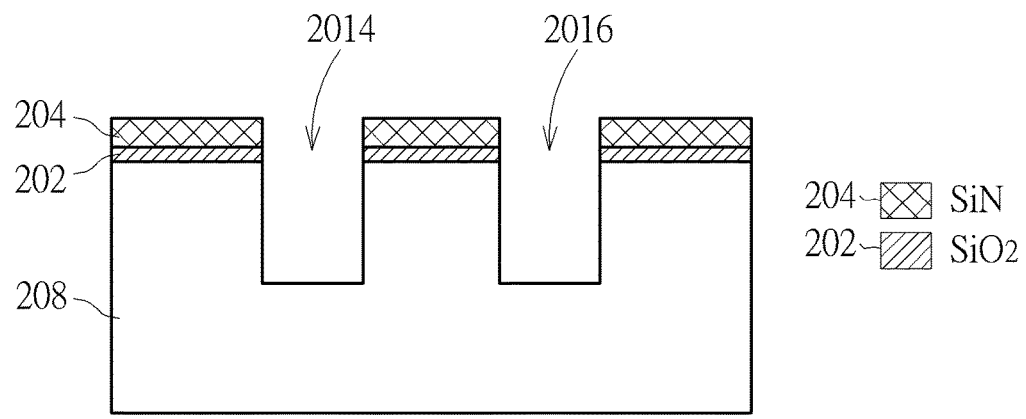
FIG. 4 is a diagram illustrating the plurality of trenches being formed within the substrate.
Figure 5:
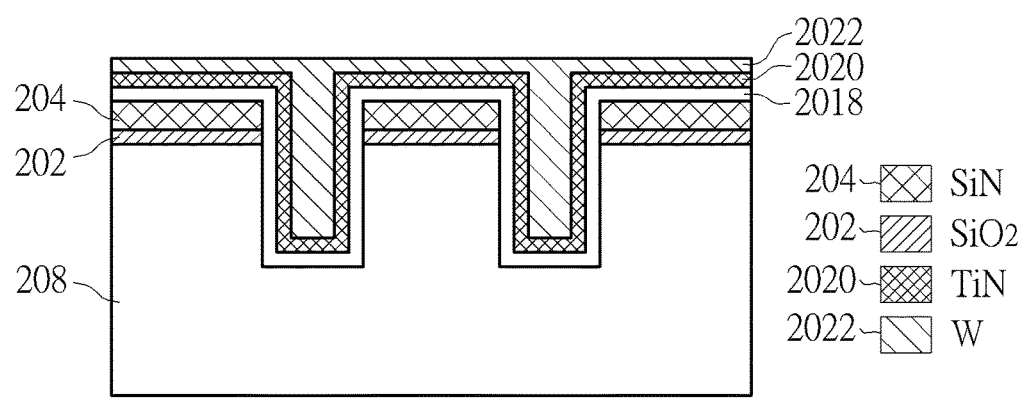
FIG. 5 is a diagram illustrating the second oxide layer, the second dielectric layer, and the metal layer being deposited on the plurality of trenches in turn.
Figure 6:
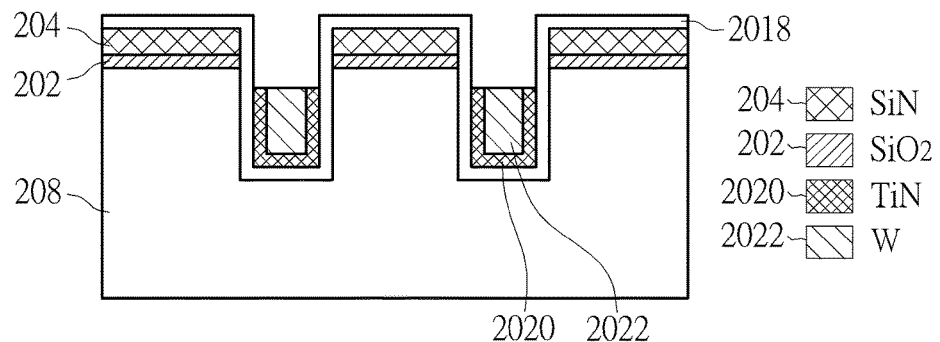
FIG. 6 is a diagram illustrating the second dielectric layer and the metal layer outside the plurality of trenches being removed by the chemical mechanical polish method and the etching back method.
Figure 7:
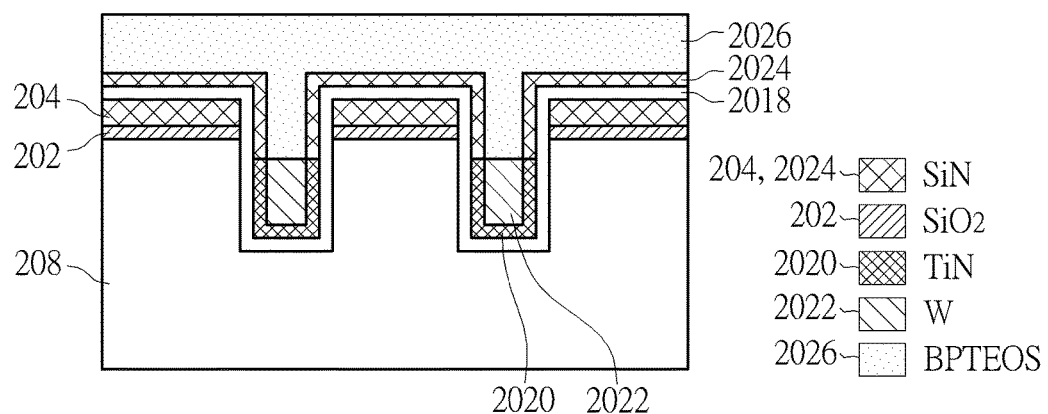
FIG. 7 is a diagram illustrating the third dielectric layer and the boron and phosphorus doped tetraethoxysilane layer being deposited in turn.
Figure 8:
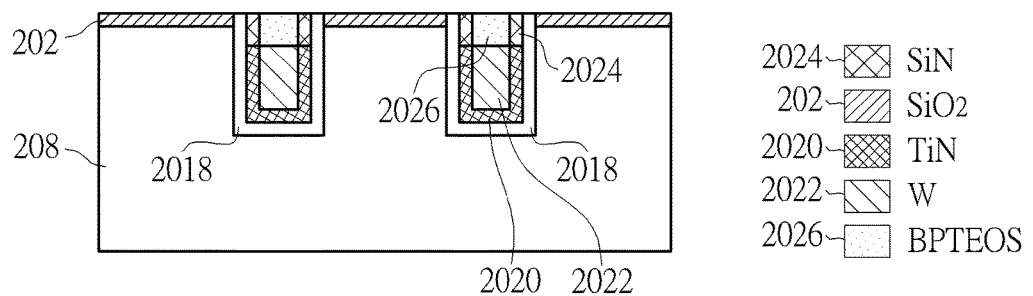
FIG. 8 is a diagram illustrating the first dielectric layer, the second oxide layer, the third dielectric layer, and the boron and phosphorus doped tetraethoxysilane layer located on the first oxide layer being removed by the chemical mechanical polish method and the hard mask method.

In Step 102, as shown in FIG. 2, the first dielectric layer 204 is formed on the first oxide layer 202 and the photoresist layer 206 is formed on the first dielectric layer 204, wherein the substrate 208 has a first conductivity type and is a Si substrate, the first oxide layer 202 is a silicon dioxide layer, and the first dielectric layer 204 is a silicon nitride (SiN) layer. In Step 104, each opening (openings 2010, 2012 shown in FIG. 3) of the plurality of openings is used for defining a position of a corresponding trench. In Step 106, because the each opening of the photoresist layer 206 is used for defining the position of the corresponding trench, the plurality of trenches (trenches 2014, 2016 shown in FIG. 4) can be etched within the substrate 208 according to the plurality of openings. In Step 108, as shown in FIG. 5, the second dielectric layer 2020 is deposited between the second oxide layer 2018 and the metal layer 2022, wherein the second oxide layer 2018 is a silicon dioxide layer, the second dielectric layer 2020 is a titanium nitride (TiN) layer, and the metal layer 2022 is composed of tungsten. In addition, the second dielectric layer 2020 is used for maintaining a threshold voltage between the second oxide layer 2018 and the metal layer 2022. In Step 110, as shown in FIG. 6, the second dielectric layer 2020 and the metal layer 2022 outside the plurality of trenches can be removed by the chemical mechanical polish method and the etching back method. In Step 112, as shown in FIG. 7, the boron and phosphorus doped tetraethoxysilane layer 2026 is deposited on the third dielectric layer 2024, the second dielectric layer 2020, and the metal layer 2022, and the boron and phosphorus doped tetraethoxysilane layer 2026 is easy to flow at high temperature, wherein the third dielectric layer 2024 is a silicon nitride layer. In Step 114, as shown in FIG. 8, the third dielectric layer 2024 and the boron and phosphorus doped tetraethoxysilane layer 2026 only exist within the each trench and on the second dielectric layer 2020 and the metal layer 2022, and heights of the third dielectric layer 2024 and the boron and phosphorus doped tetraethoxysilane layer 2026 within the each trench and on the second dielectric layer 2020 and the metal layer 2022 do not exceed the first oxide layer 202.

Figure 9:
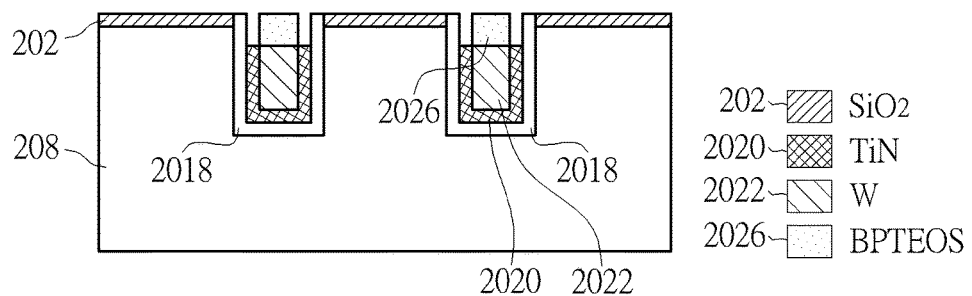
FIG. 9 is a diagram illustrating the third dielectric layer within each trench of the plurality of trenches being removed by the wet etching method.
Figure 10:
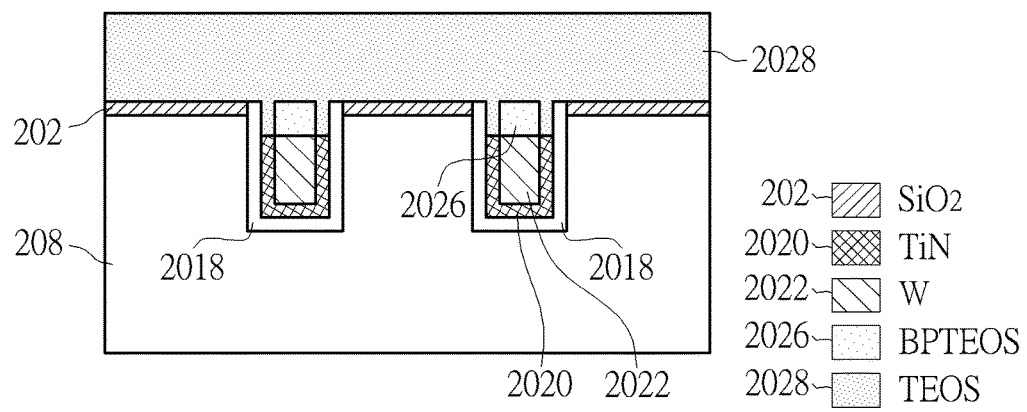
FIG. 10 is a diagram illustrating the tetraethoxysilane layer being deposited on the first oxide layer, the boron and phosphorus doped tetraethoxysilane layer, and the second dielectric layer.
Figure 11:
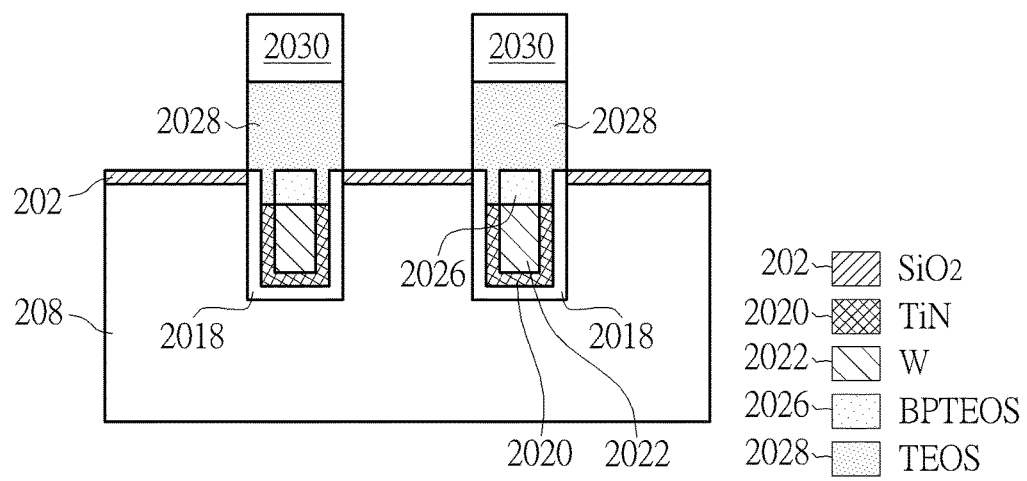
FIG. 11 is a diagram illustrating the tetraethoxysilane layer not covered by the photoresist layer being removed by the dry etching method and the photoresist layer.

In Step 116, as shown in FIG. 9, within the each trench, the third dielectric layer 2024 on the second dielectric layer 2020 and the metal layer 2022 can be removed by the wet etching. In Step 118, as shown in FIG. 10, after the third dielectric layer 2024 within the each trench is removed, the tetraethoxysilane layer 2028 can be deposited on the first oxide layer 202, the boron and phosphorus doped tetraethoxysilane layer 2026, and the second dielectric layer 2020. In Step 120, as shown in FIG. 11, the photoresist layer 2030 is used for defining corresponding openings within the substrate 208 corresponding to the plurality of drain/sources of the dynamic random access memory. In addition, because the metal layer 2020 within each of the plurality of trenches acts as a gate of the dynamic random access memory (e.g. the metal layer 2020 within the trenches 2014, 2016 acts as gates (that is, bit lines of the dynamic random access memory)) of the dynamic random access memory, Steps 102-120 are used for forming a plurality of gates of the dynamic random access memory within the substrate 208.

In addition, the present invention is not limited to used materials of the first oxide layer 202, the first dielectric layer 204, the second oxide layer 2018, the second dielectric layer 2020, the metal layer 2022, and the third dielectric layer 2024 in Steps 102-120, and the present invention is also not limited to the boron and phosphorus doped tetraethoxysilane layer 2026, and the tetraethoxysilane layer 2028. That is to say, the used materials of the first oxide layer 202, the first dielectric layer 204, the second oxide layer 2018, the second dielectric layer 2020, the metal layer 2022, and the third dielectric layer 2024 in Steps 102-120, the boron and phosphorus doped tetraethoxysilane layer 2026, and the tetraethoxysilane layer 2028 can be changed with a requirement of a designer of the dynamic random access memory. Therefore, any corresponding material for assisting information of the plurality of gates of the dynamic random access memory (the trench dynamic random access memory) within the substrate 208 falls within the scope of the present invention. In addition, the present invention is also not limited to Steps 102-120, that is, Steps 102-120 can also be changed with the requirement of the designer of the dynamic random access memory. Therefore, any corresponding Step for assisting the information of the plurality of gates of the dynamic random access memory (the trench dynamic random access memory) within the substrate 208 also falls within the scope of the present invention.

Figure 12:
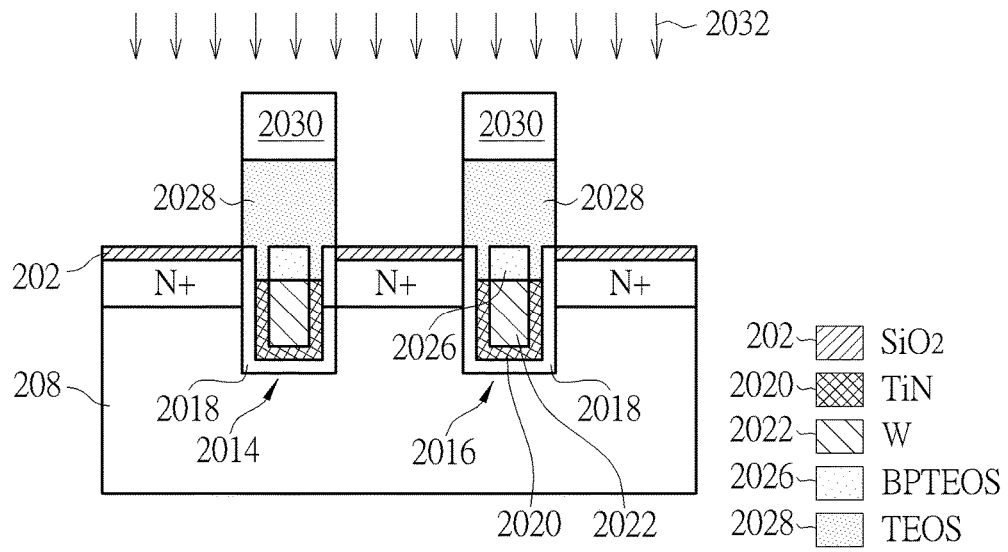
FIG. 12 is a diagram illustrating the plurality of drain/sources of the dynamic random access memory being formed within the substrate by the first ion implantation.

In Step 122, as shown in FIG. 12, after the plurality of gates of the dynamic random access memory are formed, because the photoresist layer 2030 defines the corresponding openings within the substrate 208 corresponding to the plurality of drain/sources of the dynamic random access memory, the first ion implantation 2032 can form the plurality of drain/sources (N+ shown in FIG. 12) of the dynamic random access memory within the substrate 208 through the corresponding openings, wherein the first ion implantation 2032 has a second conductivity type and the first conductivity type is opposite to the second conductivity type. In addition, as shown in FIG. 12, each gate of the plurality of gates and its adjacent gate share a corresponding drain/source (e.g. a gate located at the trench 2014 and a gate located at the trench 2016 can share a drain/source N+ between the gate located at the trench 2014 and the gate located at the trench 2016), so an area of a wafer occupied by the dynamic random access memory can be reduced.

Figure 13:
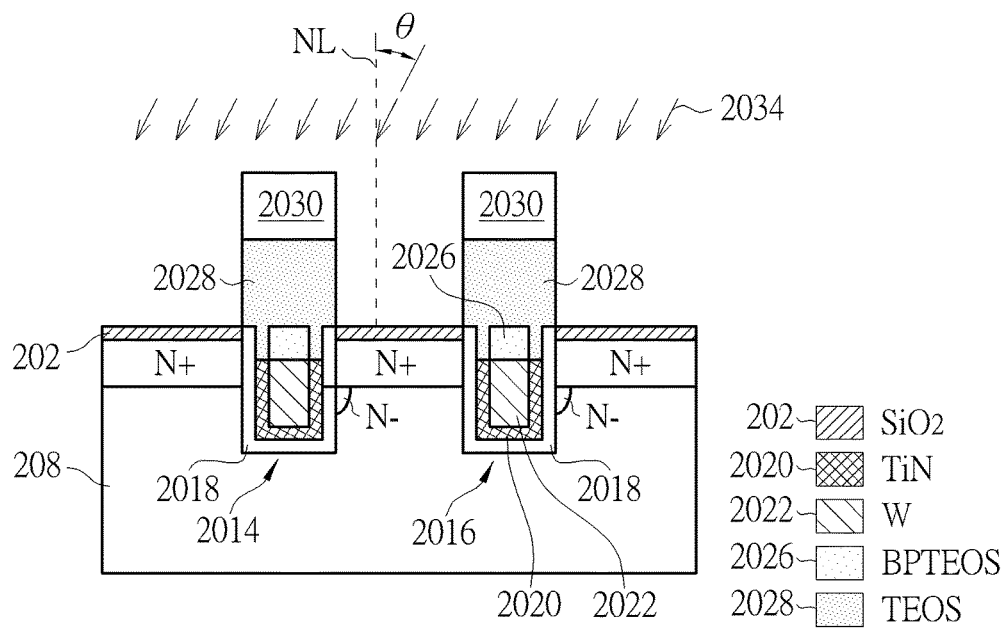
FIGS. 13, 14 are diagrams illustrating the plurality of lightly doped drain regions under the plurality of drain/sources being formed by the second ion implantation.
Figure 14:
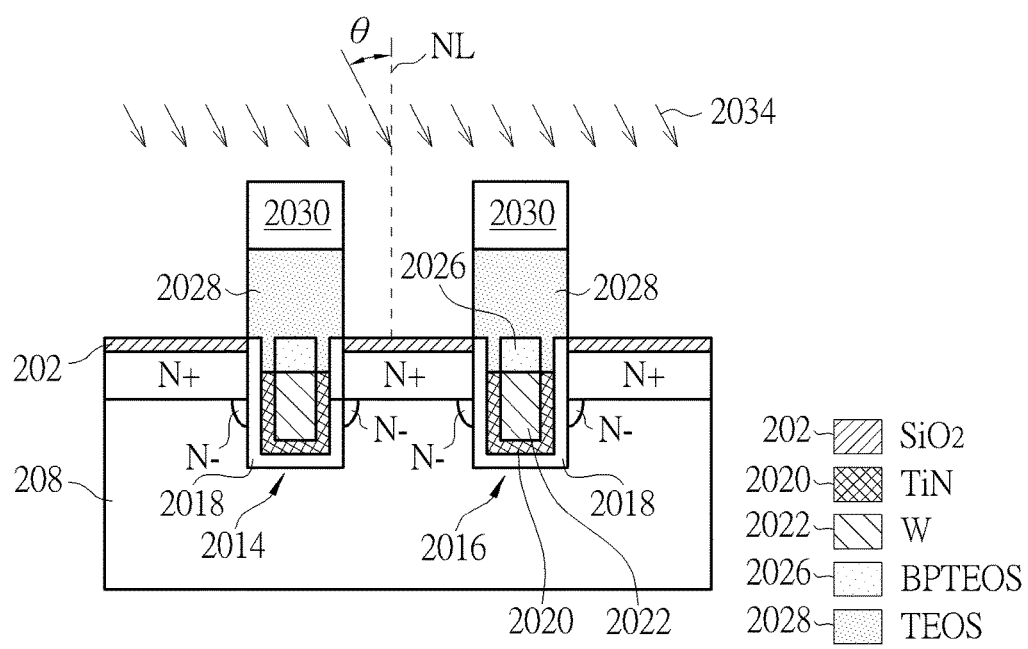

In Step 124, as shown in FIGS. 13, 14, after the plurality of drain/sources of the dynamic random access memory are formed, because the second ion implantation 2034 has a predetermined incident angle θ, the second ion implantation 2034 can form the plurality of lightly doped drains (N− shown in FIGS. 13, 14) close to the plurality of trenches and under the plurality of drain/sources also through the corresponding openings within the substrate 208 defined by the photoresist layer 2030, wherein the second ion implantation 2034 has the second conductivity type, the predetermined incident angle θ is an angle within 7°~45°, concentration of the second ion implantation 2034 is lower than concentration of the first ion implantation 2032, the concentration of the second ion implantation 2034 is between $1E13/cm^2$ and $2E15/cm^2$, and the predetermined incident angle θ is relative to a normal line NL of the plurality of drain/sources. That is to say, the second ion implantation 2034 can form the plurality of lightly doped drains through the corresponding openings within the substrate 208 defined by the photoresist layer 2030 without any additional mask. However, in another embodiment of the present invention, the second ion implantation 2034 can form the plurality of lightly doped drains close to the plurality of trenches and under the plurality of drain/sources through an additional mask. In addition, as shown in FIGS. 13, 14, the incident direction of the second ion implantation 2034 is rotatable. In addition, an ion species of the second ion implantation 2034 can be arsenic, phosphorus, phosphorus plus carbon, arsenic plus phosphorus plus carbon, or germanium plus phosphorus plus carbon, wherein carbon can limit depth of the plurality of lightly doped drains within the substrate 208 (referred to reference document).

Because the second ion implantation 2034 can form the plurality of lightly doped drains close to the plurality of trenches and under the plurality of drain/sources also through the corresponding openings within the substrate 208 defined by the photoresist layer 2030, corresponding lightly doped drains are formed under each drain/source of the plurality of drain/sources and closed to corresponding trenches. For example, as shown in FIG. 14, corresponding lightly doped drains N− are formed under the drain/source N+ between the trench 2014 and the trench 2016 and closed to corresponding trenches (i.e. the trench 2014 and the trench 2016). That is to say, as shown in FIG. 14, lightly doped drains N− are formed on side walls of two adjacent gates (located at the trench 2014 and the trench 2016), and the lightly doped drains N− are under corresponding drain/sources N+.

Because a size of the dynamic random access memory is gradually reduced, electric fields between the plurality of drain/sources and the plurality of gates are increased accordingly, resulting in Hot-Carrier effect of junctions between the plurality of drain/sources and the plurality of gates being increased. Because the Hot-Carrier effect of the junctions between the plurality of drain/sources and the plurality of gates is increased, tunneling leakage currents of the junctions between the plurality of drain/sources and the plurality of gates are also increased with increase of the Hot-Carrier effect. In addition, voltage drops between the plurality of drain/sources and the substrate 208 can also make greater junction leakage currents exist between the plurality of drain/sources and the substrate 208. Thus, the greater junction leakage currents and the greater tunneling leakage currents will make standby time of portable electronic products with the dynamic random access memory be significantly reduced.

However, because the plurality of lightly doped drains (e.g. N− shown in FIG. 14) can make the electric fields between the plurality of drain/sources and the plurality of gates and electric fields between the plurality of drain/sources and the substrate 208 move toward the plurality of drain/sources, and also make the electric fields between the plurality of drain/sources and the plurality of gates and the electric fields between the plurality of drain/sources and the substrate 208 be reduced (resulting in hot carriers existing between the plurality of drain/sources and the plurality of gates, and between the plurality of drain/sources and the substrate 208 being reduced), the plurality of lightly doped drains can effectively reduce the tunneling leakage currents of the junctions between the plurality of drain/sources and the plurality of gates, and the junction leakage currents existing between the plurality of drain/sources and the substrate 208. That is to say, the plurality of lightly doped drains can effectively reduce total leakage current (the tunneling leakage currents and the junction leakage currents) of the dynamic random access memory.

In addition, because the predetermined incident angle θ of the second ion implantation 2034 is changeable)(7°~45°)and the incident direction of the second ion implantation 2034 is rotatable, positions and depth of the plurality of lightly doped drains within the substrate 208 can be flexibly changed with the requirement of the designer of the dynamic random access memory.

Figure 15:
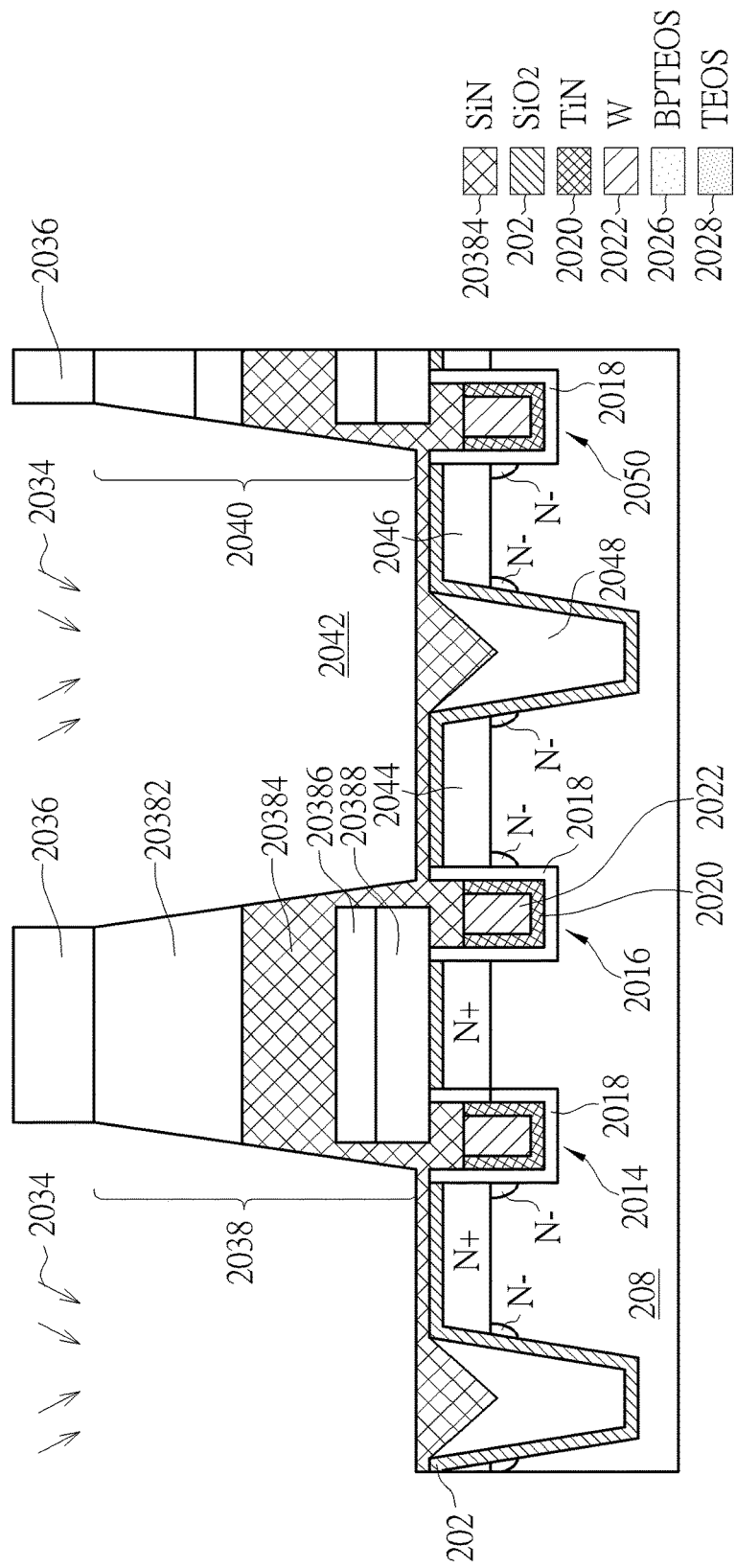
FIG. 15 is a diagram illustrating a dynamic random access memory with low leakage current according to another embodiment of the present invention.

However, in another embodiment of the present invention (shown in FIG. 15), the second ion implantation 2034 can form corresponding lightly doped drains under partial drain/sources of the plurality of drain/sources, and close to corresponding trenches and corresponding isolation layers through corresponding openings of storage capacitors of the dynamic random access memory defined by a photoresist layer 2036. For example, as shown in FIG. 15, because the photoresist layer 2036 can define an opening 2042 between storage capacitors 2038, 2040, the second ion implantation 2034 can form corresponding lightly doped drain N− under drain/sources 2044, 2046, and closed to trenches 2016, 2050 and an isolation layer 2048 through the opening 2042. That is to say, as shown in FIG. 15, the isolation layer 2048 is located between two gates, wherein lightly doped drains N− are formed on side walls of the two gates facing the isolation layer 2048 and side walls of the isolation layer 2048, and the lightly doped drains N− are under corresponding drain/sources N+. In addition, as shown in FIG. 15, the storage capacitor 2038 is a metal-insulator-metal (MIM) capacitor, and composed of dielectric layers 20382, 20384, tungsten/tungsten nitride layer 20386, and a polysilicon layer 20388. But, the present invention is not limited to a structure of the storage capacitor 2038 shown in FIG. 15, that is, the structure of the storage capacitor 2038 can be changed according to the requirement of the designer of the dynamic random access memory. In addition, the present invention is also not limited to the storage capacitor 2038 being a metal-insulator-metal capacitor. In addition, corresponding steps and materials for generating the storage capacitors 2038, 2040, and the isolation layer 2048 within the dynamic random access memory are well-known for one of ordinary skill in the art, so further description thereof is omitted for simplicity.

To sum up, because the present invention forms the plurality of lightly doped drains under all of the plurality of drain/sources or partial drain/sources of the plurality of drain/sources, the plurality of lightly doped drains can make the electric fields between the plurality of drain/sources and the plurality of gates and the electric fields between the plurality of drain/sources and the substrate be reduced, resulting in the hot carriers existing between the plurality of drain/sources and the plurality of gates, and between the plurality of drain/sources and the substrate being reduced. Therefore, the plurality of lightly doped drains can effectively reduce the tunneling leakage currents of the junctions between the plurality of drain/sources and the plurality of gates, and the junction leakage currents existing between the plurality of drain/sources and the substrate. That is to say, the plurality of lightly doped drains can effectively reduce the total leakage current of the dynamic random access memory. Thus, the present invention can make the standby time of the portable electronic products with the dynamic random access memory be significantly increased.

Reference document: K. C. Ku, C. F. Nieh, J. Gong, L. P. Huang, Y. M. Sheu, C. C. Wang, C. H. Chen, H. Chang, L. T. Wang, T. L. Lee, S. C. Chen, and M. S. Liang, " Effects of germanium and carbon coimplants on phosphorus diffusion in silicon", Appl. Phys. Lett. 89, 112104, 2006.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a dynamic random access memory with low leakage current, comprising:
   forming a plurality of gates of the dynamic random access memory within a substrate of the dynamic random access memory;
   forming a plurality of drain/sources of the dynamic random access memory within the substrate by a first ion implantation; and
   forming a plurality of lightly doped drains under all of the plurality of drain/sources or partial drain/sources of the plurality of drain/sources by a second ion implantation after the plurality of drain/sources are formed, wherein the plurality of lightly doped drains is used for reducing a leakage current within the dynamic random access memory, and the second ion implantation has a predetermined incident angle;
   wherein an upper surface of each lightly doped drain of the plurality of lightly doped drains is connected to a partial lower surface of a corresponding drain/source on the each lightly doped drain.

2. The manufacturing method of claim 1, wherein concentration of the second ion implantation is lower than concentration of the first ion implantation.

3. The manufacturing method of claim 1, wherein the substrate has a first conductivity type, the first ion implantation and the second ion implantation have a second conductivity type, and the first conductivity type is opposite to the second conductivity type.

4. The manufacturing method of claim 1, wherein the plurality of gates act as bit lines of the dynamic random access memory.

5. The manufacturing method of claim 1, wherein ion species corresponding to the second ion implantation is arsenic, phosphorus, phosphorus plus carbon, arsenic plus phosphorus plus carbon, or germanium plus phosphorus plus carbon.

6. The manufacturing method of claim 1, wherein the predetermined incident angle is an angle within 7°~45°.

7. The manufacturing method of claim 1, wherein the plurality of gates are metal gates composed of tungsten.

8. The manufacturing method of claim 1, wherein an incident direction of the second ion implantation is rotatable.

9. The manufacturing method of claim 1, wherein concentration of the second ion implantation is between $1E13/cm^2$ and $2E15/cm^2$.

10. A dynamic random access memory with low leakage current, comprising:
   a substrate;
   a plurality of gates formed within the substrate;
   a plurality of drain/sources, wherein the plurality of drain/sources are formed within the substrate by a first ion implantation; and
   a plurality of lightly doped drains, wherein the plurality of lightly doped drains are formed under all of the plurality of drain/sources or partial drain/sources of the plurality of drain/sources by a second ion implantation, wherein the plurality of lightly doped drains is used for reducing a leakage current within the dynamic random access memory, and the second ion implantation has a predetermined incident angle;
   wherein an upper surface of each lightly doped drain of the plurality of lightly doped drains is connected to a partial lower surface of a corresponding drain/source on the each lightly doped drain.

11. The dynamic random access memory of claim 10, wherein concentration of the second ion implantation is lower than concentration of the first ion implantation.

12. The dynamic random access memory of claim 10, wherein the substrate has a first conductivity type, the first ion implantation and the second ion implantation have a second conductivity type, and the first conductivity type is opposite to the second conductivity type.

13. The dynamic random access memory of claim 10, wherein the plurality of gates act as bit lines of the dynamic random access memory.

14. The dynamic random access memory of claim 10, wherein ion species corresponding to the second ion implantation is arsenic, phosphorus, phosphorus plus carbon, arsenic plus phosphorus plus carbon, or germanium plus phosphorus plus carbon.

15. The dynamic random access memory of claim 10, wherein the predetermined incident angle is an angle within 7°~45°.

16. The dynamic random access memory of claim 10, wherein the plurality of gates are metal gates composed of tungsten.

17. The dynamic random access memory of claim 10, wherein each gate of the plurality of gates and an adjacent gate thereof share the corresponding drain/source.

18. The dynamic random access memory of claim 10, wherein an incident direction of the second ion implantation is rotatable.

19. The dynamic random access memory of claim 10, wherein concentration of the second ion implantation is between $1E13/cm^2$ and $2E15/cm^2$.

20. A dynamic random access memory with low leakage current, comprising:
   a substrate;
   a plurality of gates formed within the substrate;
   a plurality of drain/sources, wherein the plurality of drain/sources are formed within the substrate by a first ion implantation; and
   a plurality of lightly doped drains, wherein the plurality of lightly doped drains are formed under all of the plurality of drain/sources or partial drain/sources of the plurality of drain/sources by a second ion implantation, wherein the plurality of lightly doped drains is used for reducing a leakage current within the dynamic random access memory, an upper surface of each lightly doped drain of the plurality of lightly doped drains is connected to a partial lower surface of a corresponding drain/source on the each lightly doped drain.

21. A dynamic random access memory with low leakage current, comprising:
   a substrate;
   a plurality of gates formed within the substrate;
   a plurality of drain/sources formed within the substrate; and
   a plurality of lightly doped drains, wherein lightly doped drains are formed on side walls of two adjacent gates, and the lightly doped drains are under corresponding drain/sources;
   wherein an upper surface of each lightly doped drain of the plurality of lightly doped drains is connected to a partial lower surface of a corresponding drain/source on the each lightly doped drain.

22. A dynamic random access memory with low leakage current, comprising:
   a substrate;
   a plurality of gates formed within the substrate;
   a plurality of drain/sources formed within the substrate;
   a plurality of isolation layers formed within the substrate, and each isolation layer is located between two gates; and
   a plurality of lightly doped drains, wherein lightly doped drains are formed on side walls of the two gates facing the each isolation layer and side walls of the each isolation layer, and the lightly doped drains are under corresponding drain/sources;
   wherein an upper surface of each lightly doped drain of the plurality of lightly doped drains is connected to a partial lower surface of the a corresponding drain/source on the each lightly doped drain.

* * * * *